US006761273B1

(12) United States Patent
Chen et al.

(10) Patent No.: US 6,761,273 B1
(45) Date of Patent: Jul. 13, 2004

(54) FAST INSTALLATION/REMOVAL STRUCTURE FOR CIRCUIT BOARD

(75) Inventors: Aries Chen, Taipei (TW); Chang Lu Chang, Taipei (TW)

(73) Assignee: First International Computer Inc., Taipei (TW)

( * ) Notice: Subject to any disclaimer, the term of this patent is extended or adjusted under 35 U.S.C. 154(b) by 24 days.

(21) Appl. No.: 10/330,380

(22) Filed: Dec. 30, 2002

(51) Int. Cl.$^7$ .................................................. H05K 5/00
(52) U.S. Cl. ...................... 211/41.17; 361/759; 211/26
(58) Field of Search ............................... 211/26, 41.17; 361/752, 759, 683

(56) References Cited

U.S. PATENT DOCUMENTS

| | | | | |
|---|---|---|---|---|
| 5,796,593 A | * | 8/1998 | Mills et al. | 361/801 |
| 5,978,232 A | * | 11/1999 | Jo | 361/796 |
| 6,262,887 B1 | * | 7/2001 | Lee | 361/683 |
| 6,267,254 B1 | * | 7/2001 | Chen | 211/26 |
| 6,362,968 B1 | * | 3/2002 | Lajara et al. | 361/752 |
| 6,424,540 B1 | * | 7/2002 | Chen et al. | 361/759 |
| 6,625,035 B1 | * | 9/2003 | Steinman et al. | 361/759 |

* cited by examiner

Primary Examiner—Robert W. Gibson, Jr.
(74) Attorney, Agent, or Firm—Browdy and Neimark, P.L.L.C.

(57) ABSTRACT

A fast installation/removal structure includes an upper board, a lower board, and an installation/removal lever. The upper board has hooking grooves and at least a positioning pin. The lower board has snap fitting devices and at least a sliding slot through which slidably inserts the positioning pin. A front end of the lever is pivotally connected to the lower board there below, and has a guide groove through which the positioning pin inserts. A rear end of the lever is externally accessible to allow manipulation by the user. With the circuit board securely fastened thereon, the upper board is placed on the lower board. The snap fitting devices respectively engage through the hooking grooves. By turning the lever, the positioning pin slides along the sliding slot to have the snap fitting devices respectively snap fit through the hooking grooves, thereby fastening the upper board to the lower board.

14 Claims, 8 Drawing Sheets

FAST INSTALLATION/REMOVAL STRUCTURE FOR CIRCUIT BOARD

BACKGROUND OF THE INVENTION

1. Field of the Invention

The invention relates to a fast installation/removal structure for a circuit board of an electric appliance. More particularly, the invention provides a fast installation/removal structure that uses a slidable snap fitting to install and remove easily the circuit board so that the maintenance of the electric appliance is convenient.

2. Description of the Related Art

Among the different components of an electric appliance, such as a computer unit, are usually a circuit board, a power supply, and a casing. The design of the circuit board conventionally determines the principal functions of the electric appliance. The power supply provides the electric power necessary to operate the electric appliance, and the casing externally protects all the components of the electric appliance. The circuit board of the electric appliance is further usually provided with the possibility of multiple extension connections to flexibly accommodate the need of the user.

The different components of the electric appliance conventionally are produced by different manufacturers and are finally assembled in an assembly site. A fast and convenient assembly structure, suitable for different component designs from different manufacturers, is needed to reduce the assembly time and satisfy a demand of fast product delivery.

Figure 1:
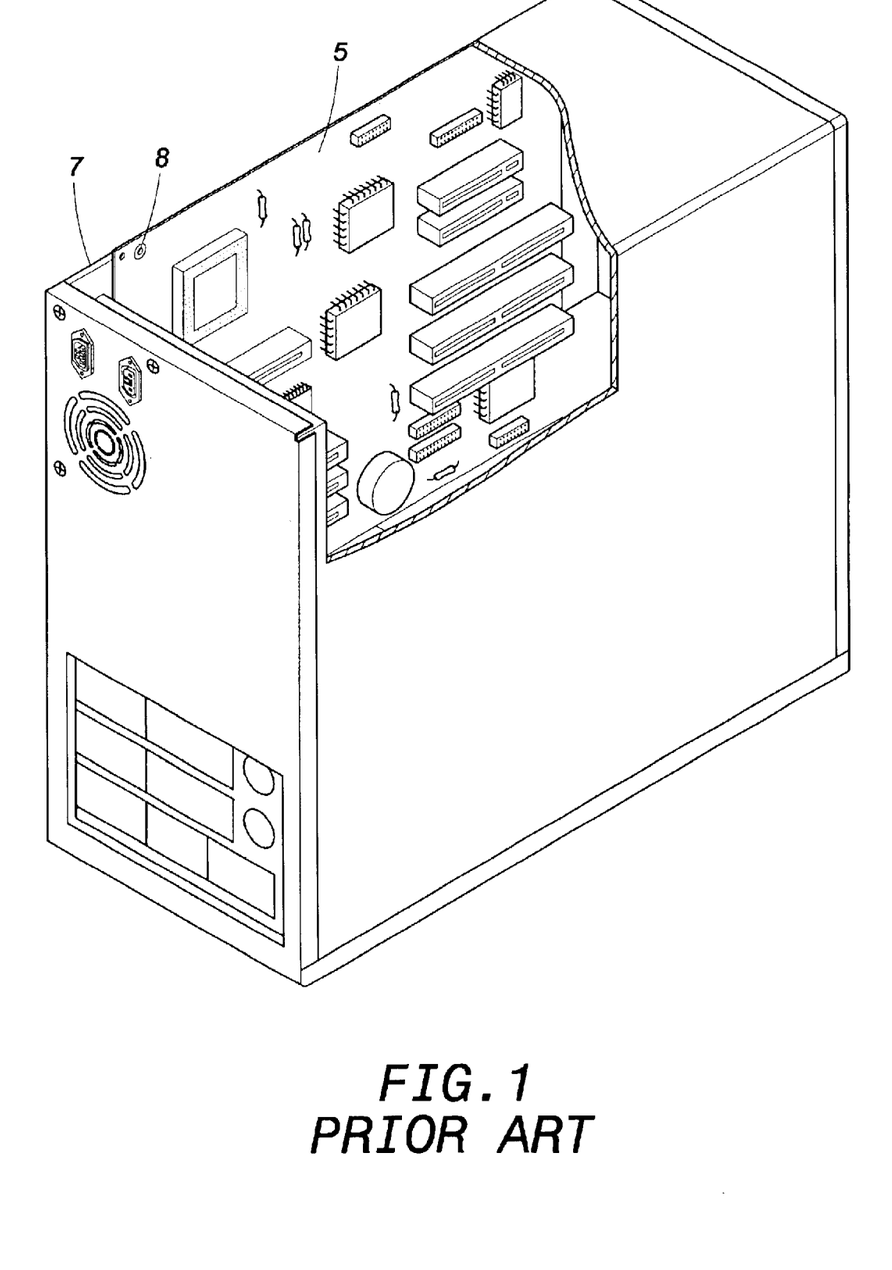
FIG. 1 is a schematic view of a conventional assembly of a circuit board in an electric appliance.

Referring to FIG. 1, a conventional installation/removal structure for the circuit board of the electric appliance consists of screw assembly 8 that engages through threaded holes of the circuit board 5 and lateral panel 7 of the casing of the electric appliance for attachment. In mass production, a tool is therefore needed to lock multiple screws 8, which is time-consuming and may be cumbersome.

When the circuit board of the electric appliance has to be tested or replaced, an adequate tool therefore has to be at hand to remove the screws. When the circuit board is installed, the manipulation of the screws, usually of small size, may cause the screw to be dropped and lost. As a result, an insufficient number of mounted fastening screws or, alternatively, the biased engagement of the screws, cause a poor attachment of the circuit board, which may be detrimental to normal operation of the electric appliance. In the worst situations, the screws may drop into the electric appliance and cause a short-circuit. Therefore, the conventional installation/removal structure not only is cumbersome, but may also cause a deterioration of the performance of the components of the electric appliance.

SUMMARY OF THE INVENTION

It is therefore a principal object of the invention to provide a fast installation/removal structure for a circuit board of an electric appliance that allows easy installation and removal of the circuit board and is suitable for different types of circuit board design. The maintenance of the circuit board is thereby convenient and the efficiency of the production is further improved.

It is another object of the invention to provide a fast installation/removal structure for a circuit board of an electric appliance that allows a secure assembly of the circuit board, which ensures a normal operation of the electric appliance.

To accomplish the above and other objectives, the fast installation/removal structure of the invention comprises an upper board, a lower board, and an installation/removal lever. The upper board includes a plurality of hooking grooves and at least a positioning pin. The lower board includes a plurality of snap fitting devices corresponding to the hooking grooves to fasten with the upper board, and at least a sliding slot through which slidably inserts the positioning pin. A front end of the lever closely lies under the bottom of the lower board and is pivotally connected thereto. The front end includes a guide groove through which the positioning pin inserts after the sliding slot of the lower board. A rear end of the lever is externally accessible to allow manipulation by the user. With the circuit board being securely fastened thereon, the upper board is placed on the lower board. The snap fitting devices of the lower board respectively engage through the hooking grooves of the upper board. By turning the rear end of the lever, the user drives the slide of the positioning pin along the sliding slot of the lower base to have cause the, snap fitting devices respectively to snap fit with the hooking grooves, thereby fastening the upper board with the lower board.

To provide a further understanding of the invention, the following detailed description illustrates embodiments and examples of the invention that are provided for explaining the invention and should not be construed to limit the scope of the invention.

BRIEF DESCRIPTION OF THE DRAWINGS

The drawings included herein provide a further understanding of the invention.

A brief introduction of the drawings is as follows.

DETAILED DESCRIPTION OF THE EMBODIMENTS

Wherever possible in the following description, like reference numerals will refer to like elements and parts unless otherwise illustrated.

Figure 2:
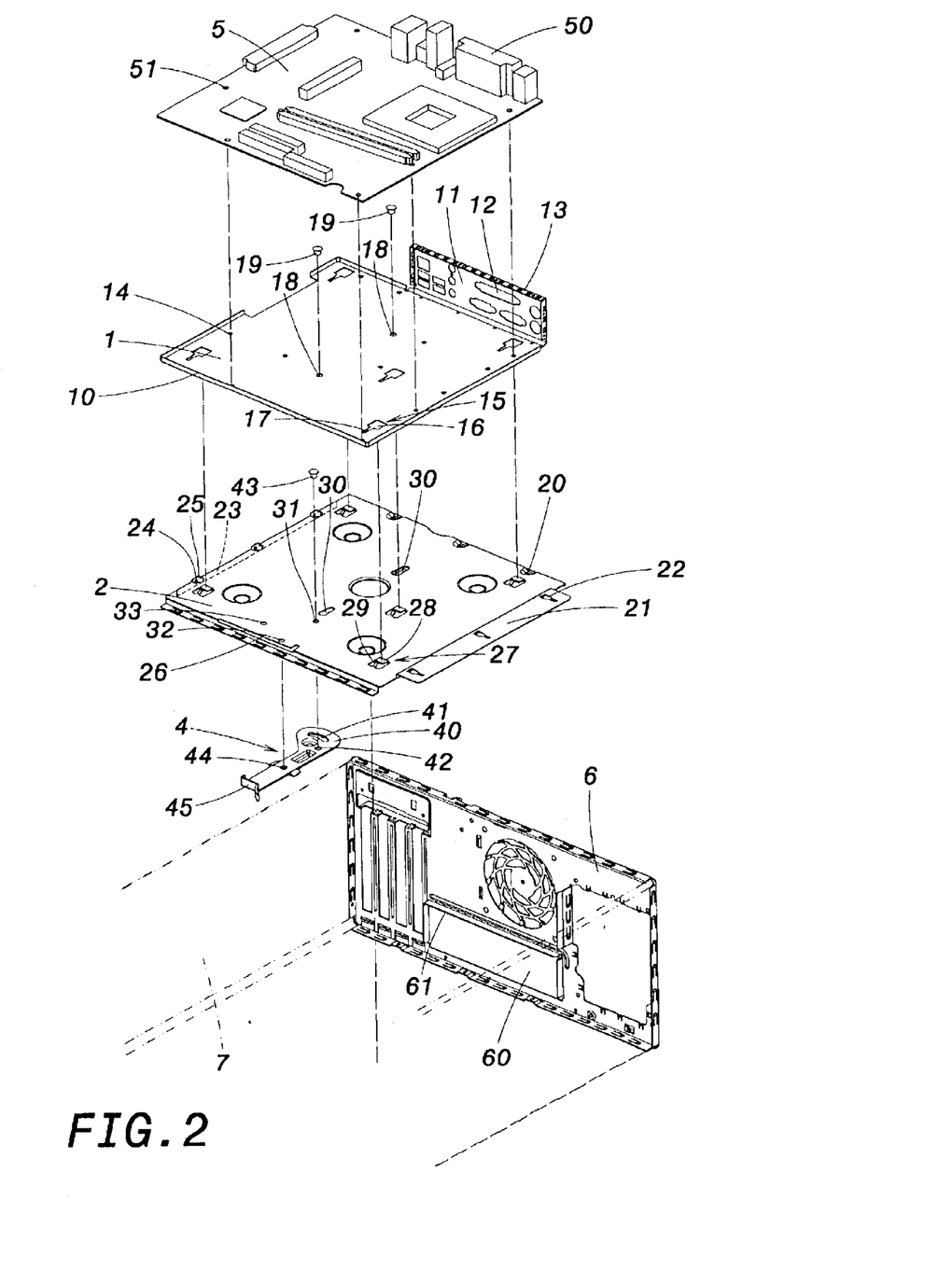
FIG. 2 is an exploded view of a fast installation/removal structure for a circuit board according to an embodiment of the invention.

Referring to FIG. 2, the invention provides a fast installation/removal structure for the circuit board of an electric appliance. In this embodiment, the electric appliance is, for example, a computer and, more particularly, a computer principal unit. However, the skilled artisan will understand that the invention as described hereafter may be also advantageous for various electric appliances. The fast installation/removal structure comprises an upper board 1, a lower board 2, and an installation/removal lever 4.

The upper board 1 is a thin metallic board formed by, for example, stamping, and is approximately as large as the circuit board 5 of the computer unit. The circuit board 5 includes a connector 50 and threaded holes 51. A peripheral side of the upper board 1 forms a bent edge 10, one portion of which further constitutes a bent hole-connecting panel 11. The hole-connecting panel 11 comprises a connecting hole 12 that corresponds to the connector 50 of the circuit board 5 for receiving the engagement of an external connector. A peripheral side of the panel 11 further includes a bent edge 13 that overlies the upper board 1. Screws engage through holes 14 of the upper board 1 to fasten securely the circuit board 5. The upper board 1 also includes hooking grooves 15 that respectively comprise a locating opening 16 and a narrower snap fitting slot 17. Positioning pins 19 pass through positioning holes 18 and bottom of the upper board 1.

The lower board 2 is a thin metallic board formed by stamping, and is approximately as large as the upper board 1. A peripheral side of the lower board 2 is provided with threaded holes 20 for attaching the lower board 2 to a rear panel 6 of the casing of the computer unit. The rear panel 6 includes a connector opening 60 that has a bent side 61. A first side of the lower board 2 forms an upwardly offset, step-shaped attaching strip 21 formed by, for example, bending. The attaching strip 21 includes fastening holes 22 for attaching a power supply. A second side of the lower board 2 opposite to the attaching strip 21 is downwardly bent into another attaching strip 23 that is provided with fastening holes 24 for screw assembly with a lateral panel 7 of the casing of the computer unit. At the location corresponding to the attaching strip 23, the lower board 2 is further provided with projections 25 that protrude upward. The bent edge 10 at the peripheral side of the upper board 1 snap fits between the projections 25 and the attaching strip 21, which thereby accurately positions the upper board 1. A third side of the lower board 2 is provided with a side slot 26 formed by, for example, bending. The surface of the lower board 2 includes snap fitting devices 27 that respectively correspond to the hooking grooves 15 to fasten the upper board 1. Each snap fitting device 27 has a hooking finger 28 one side of which connects the lower board 2 via a snap fitting strip 29 (as better described in FIG. 6 and FIG. 7). The hooking fingers 28 are dedicated to snap fit with a rim of the locating openings 16, respectively, and the snap fitting strips 29 to snap fit through the snap fitting slots 17, respectively. The lower board 2 also includes sliding slots 30 for respectively receiving the positioning pins 19 of the upper board 1. Between the sliding slots 30 and the side slot 26 of the lower board 2 is formed a pivotal hole 31. Separation anchoring protrusion 32 and engagement anchoring protrusion 33 are formed on the bottom of the lower board 2 proximate to the slot 26, both anchoring protrusions 32, 33 being equidistant to the pivotal hole 31.

The lever 4 is a metallic thin rod formed by, for example, stamping, and includes a front end that inserts through the slot 26 to lie tightly adjacent to the bottom of the lower board 2. The front end of the lever 4 forms a wide portion 40 in which is formed an arcuate guide groove 41 approximately corresponding to the sliding slot 30 of the lower board 2 that is closer to the slot 26. The corresponding positioning pin 19 of the upper board 1 is inserted through the sliding slot 30 and guide groove 41. A pivotal hole 42, corresponding to the pivotal hole 31 of the lower board 2, is formed through the wide portion 40 at a location eccentric relative to the center of curvature of the guide groove 41. A connecting element 43 pivotally is inserted through the pivotal hole 42 and the pivotal hole 31. A central portion of the lever 4 includes a positioning hole 44 that is placed in a manner that its distance with the pivotal hole 42 is equal to that between either the separation anchoring protrusion 32 or the engagement anchoring protrusion 33 and the pivotal hole 31. Either the separation anchoring protrusion 32 or the engagement anchoring protrusion 33 can thereby engage the positioning hole 44. A rear end of the lever 4 comprises an operating portion 45 that extends through the slot 26 outside the lower board 2.

The mounting and dismounting operations by means of the above installation/removal device of the invention are performed as follows.

Figure 3:
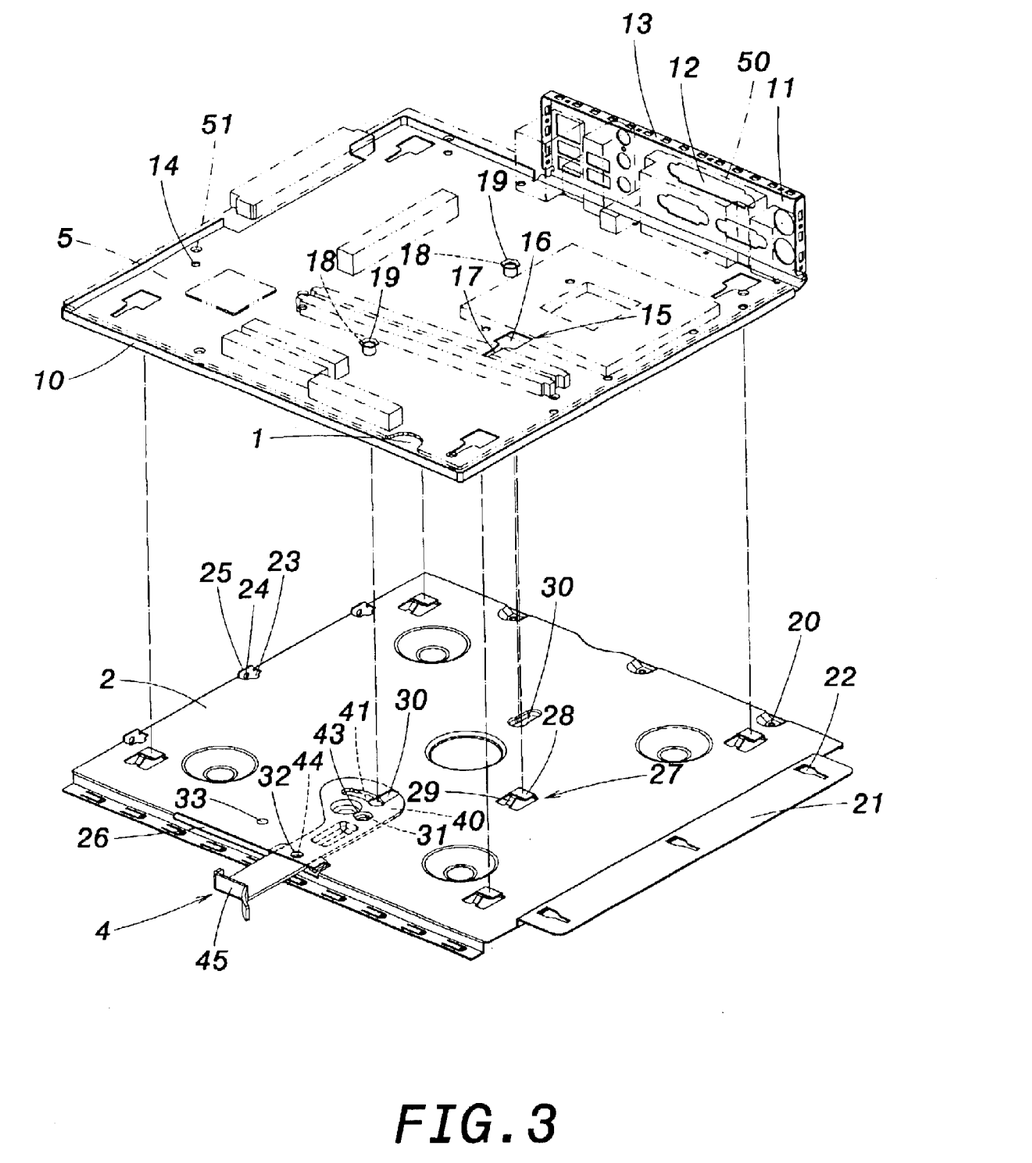
FIG. 3 is a perspective view illustrating the assembly of the circuit board on the upper board and the assembly of the installation/removal lever under the lower board, according to an embodiment of the invention.

Referring to. FIG. 3, when a mounting operation is to be performed, the circuit board 5 is placed on the upper board 1 and positioned within the bent edge 10. Screws engage through the threaded holes 51, 14 to fasten the circuit board 5 to the upper board 1. The positioning hole 44 of the lever 4 initially engages with the separation anchoring protrusion 32 of the lower board 2.

Figure 4:
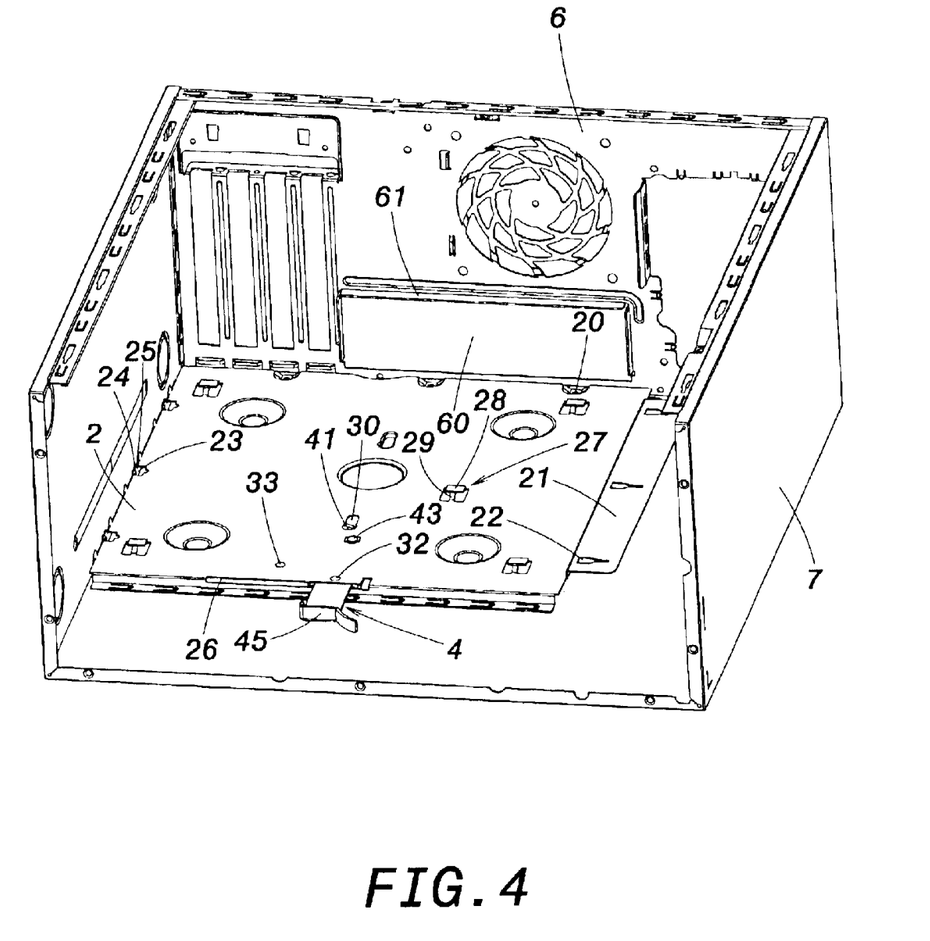
FIG. 4 is a perspective view illustrating the assembly of the lower board with the casing of the electric appliance, according to an embodiment of the invention.

Referring to FIG. 4, the lower board 2 is securely fastened with the rear panel 6 and lateral panel 7 of the casing of the computer unit via a screw assembly through the threaded holes 20 and fastening holes 24.

Figure 5:
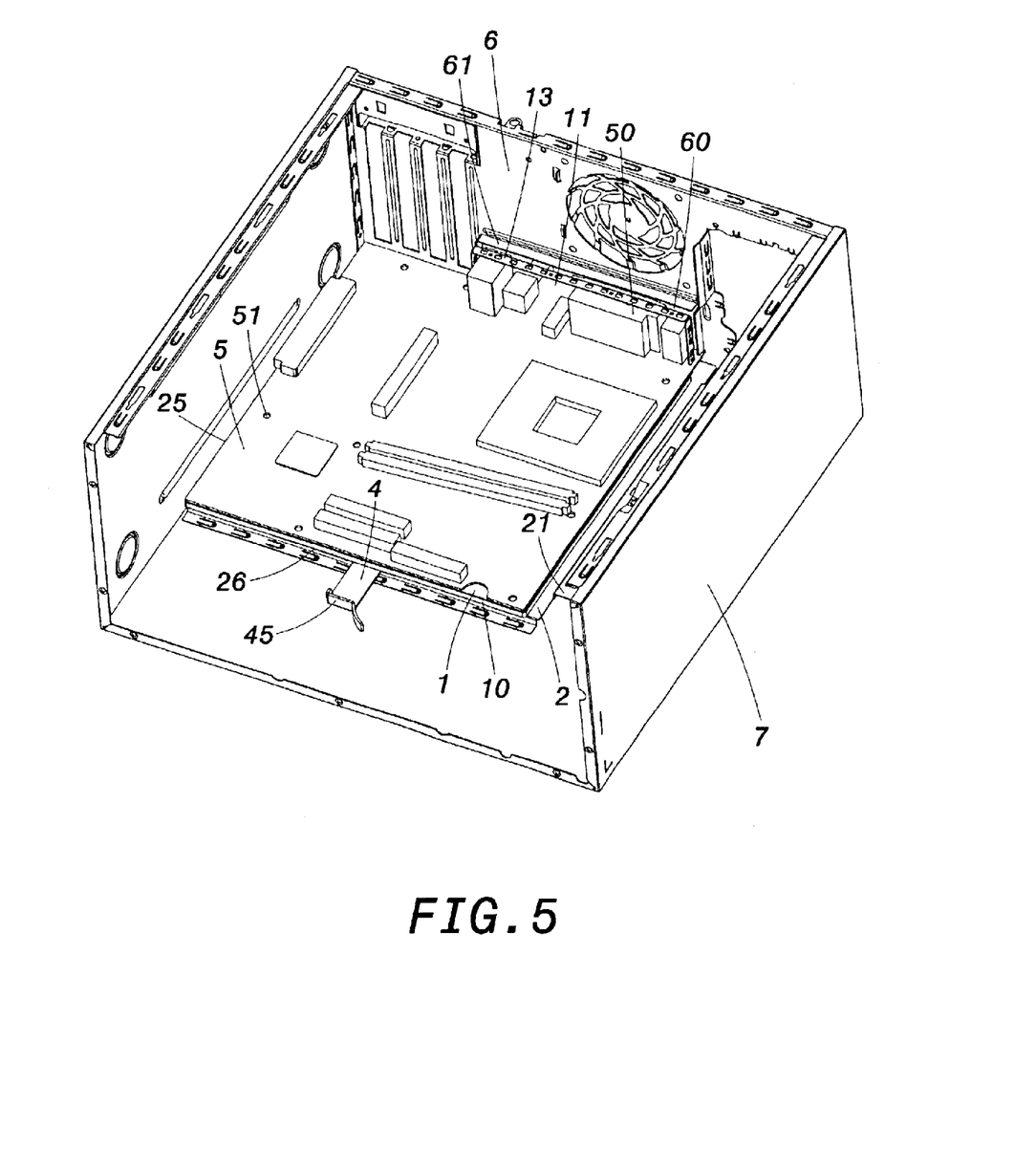
FIG. 5 is a schematic view illustrating the placement of the upper board on the lower board, according to an embodiment of the invention.

Referring to FIG. 5, the upper board 1 with the circuit board 5 attached thereon is placed on the lower board 2, positioned between the attaching strip 21 and the projections 25 in a manner that the snap fitting devices 27 are respectively placed in the hooking grooves 15.

Figure 6:
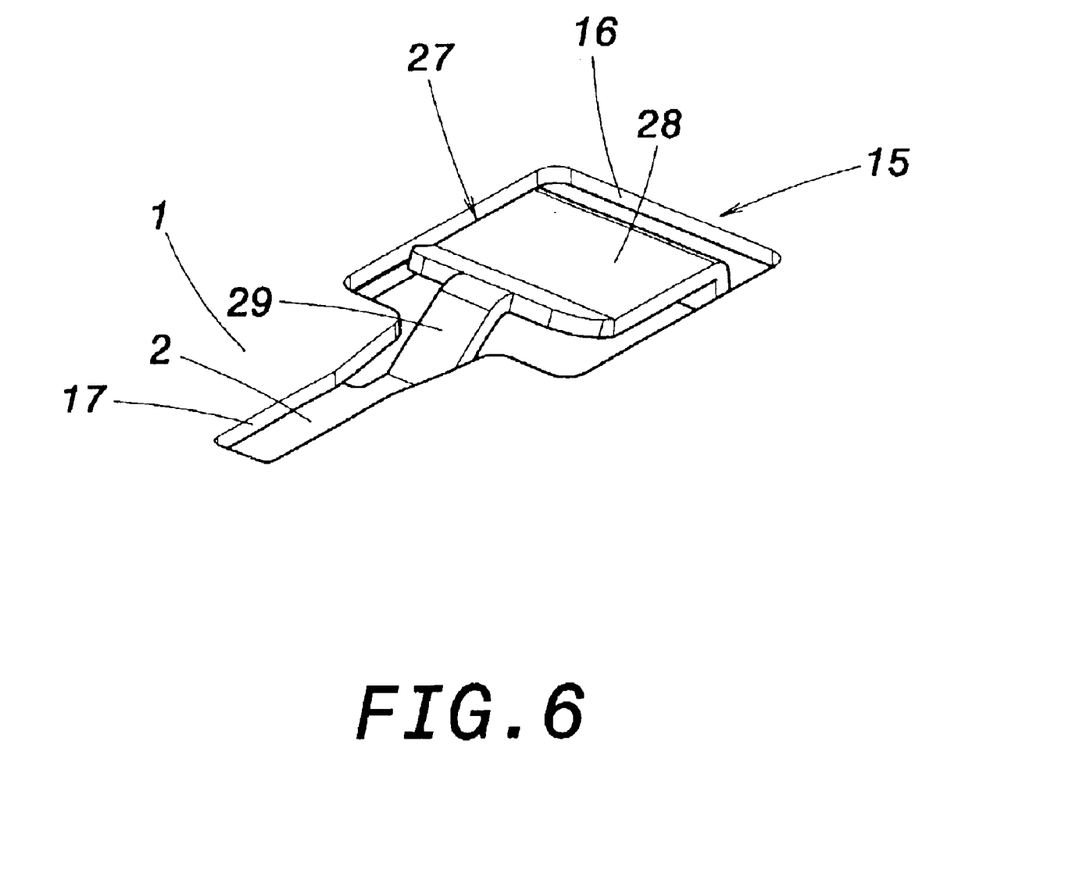
FIG. 6 is a perspective view particularly illustrating the insertion of the snap fitting device in the hooking groove, according to an embodiment of the invention.

Referring to FIG. 6 and FIG. 3, the positioning pins 19 respectively engage through the sliding slots 30 of the lower board 2, one positioning pin 19 further engaging through the guide groove 41 of the lever 4.

Figure 7:
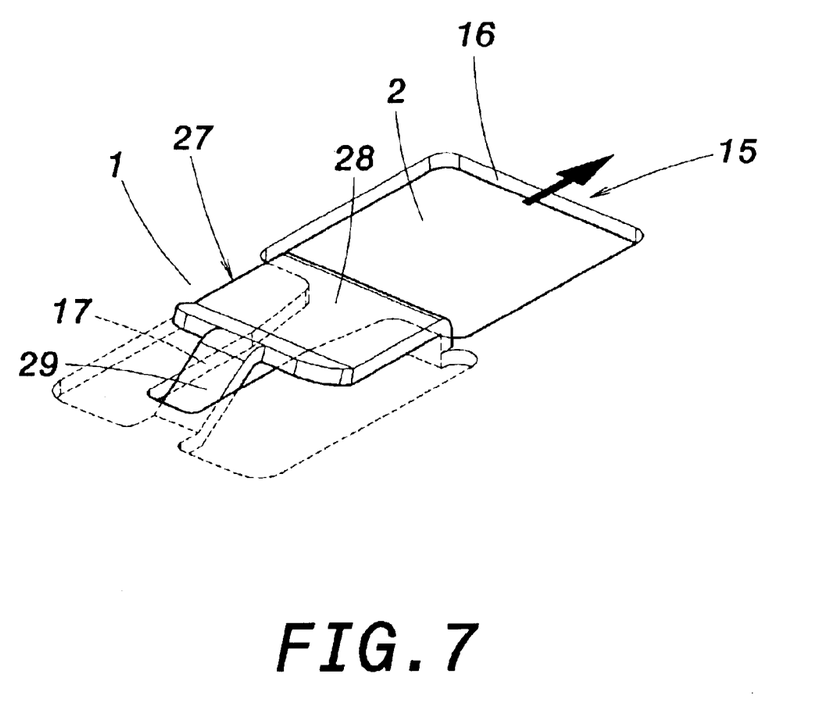
FIG. 7 is a perspective view particularly illustrating the snap fitting of the snap fitting device with the hooking groove according to an embodiment of the invention.
Figure 8:
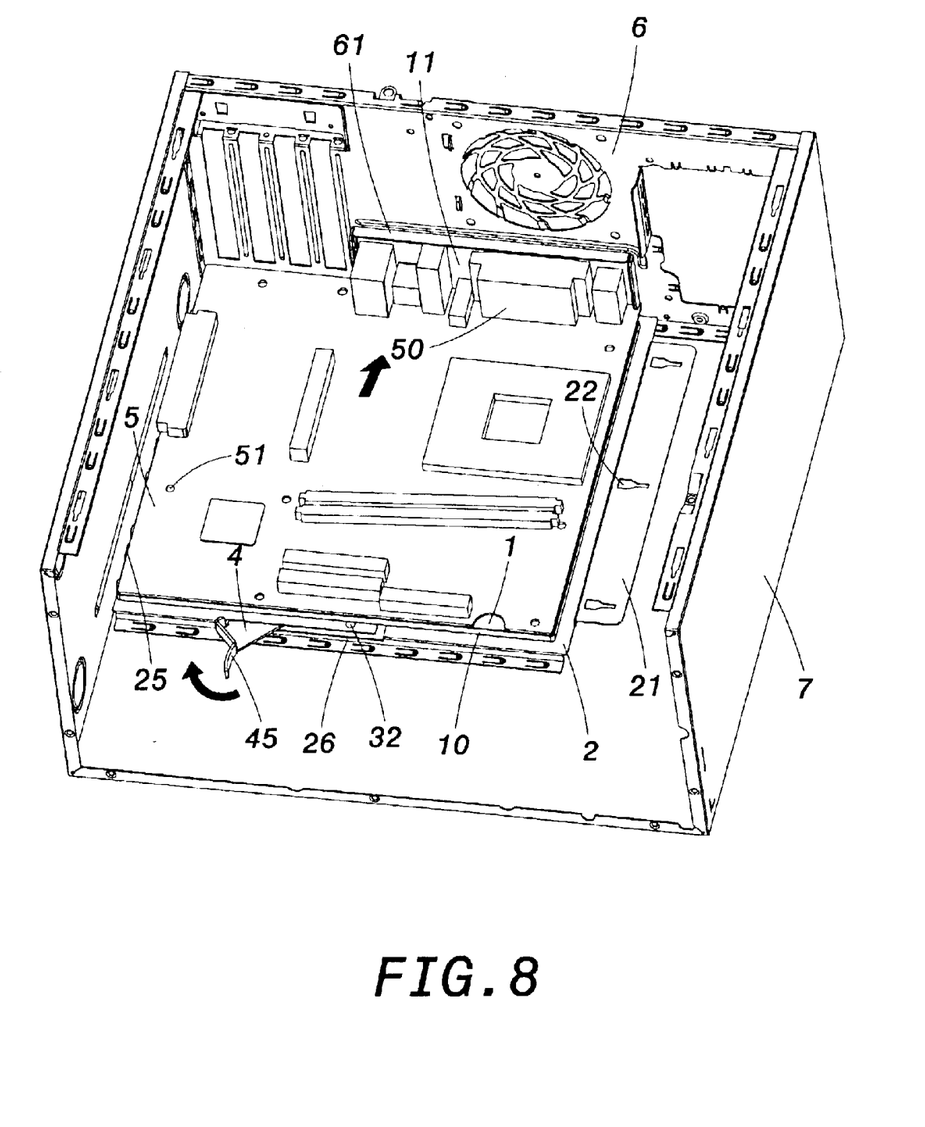
FIG. 8 is a perspective view illustrating the fastening of the lower board with the upper board inside the casing of the electric appliance according to an embodiment of the invention.

Referring to FIG. 8, the user laterally turns the operating portion 45 of the lever 4 so that the positioning hole 44 disengages from the separation anchoring protrusion 32 to engage the engagement anchoring protrusion 33. By rotation around the eccentric pivotal hole 42, the guide groove 41 thereby drives a relative slide of the corresponding positioning pin 19, along with the other positioning pin 19, along the respective sliding slots 30 of the lower board 2 so that the snap fitting strips 29 respectively snap fit through the snap fitting slots 17. As a result, the hooking fingers 28 snap fit with the respective rims of the locating openings 16, as illustrated in FIG. 7.

Referring to FIG. 5 and FIG. 8, the bent edge 13 of the panel 11 is not inserted under the bent edge 61 of the connector opening 60. Thereby is favorably assembled the circuit board 5 inside the computer unit. If the circuit board 5 has to be separately tested or replaced, the user reverses the process and turns the operating portion 45 of the lever 4 to disengage the positioning hole 44 from the engagement anchoring protrusion 33. The positioning hole 44 subsequently engages the separation anchoring protrusion 32, which causes the guide groove 41 to drive the corresponding positioning pin 19 to recover its initial position in the sliding slot 30. As a result, the snap fitting slots 17 respectively disengage from the snap fitting strips 29 and the hooking fingers 28 recover their respective disengaging positions in the openings 16. The upper board 1 then can be easily removed without the need of a screw removal operation.

As described above, the invention therefore includes the following advantages.

(1) By means of the installation/removal lever, the circuit board can be easily installed and removed without the particular need of tools. The maintenance, testing and replacement of the circuit board are therefore convenient. The installation/removal structure of the invention further is suitable for different types of circuit board design, which improves the production efficiency.

(2) The assembly of the upper/lower boards and installation/removal lever do not require any screw assembly, which simplifies the assembly elements.

(3) By the design of the hooking grooves and snap fitting devices, the bent edge of the hole connecting panel of the upper board does not snap fit with the bent edge of the connector opening of the casing of the computer unit. The assembly of the circuit board is therefore secure, which ensures a stable and normal operation of the computer.

Those skilled in the art will readily appreciate that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A fast installation/removal structure for a circuit board of an electric appliance having a casing with a rear panel, comprising:

an upper board, including a plurality of hooking grooves and at least a positioning pin;

a lower board, including a plurality of snap fitting devices correspondingly snap fitting with the hooking grooves of the upper board to attach the upper board, the lower board further including at least a sliding slot through which slidably inserts the positioning pin; and a installation/removal lever, including a rear end lying outside the lower board to be accessible to user for installation/removal operations, and a front end lying closely under a bottom of the lower board and connected to the lower board via a pivotal point, the front end further including a guide groove eccentric to the pivotal point, wherein the positioning pin is inserted through the sliding slot of the lower board and the guide groove of the lever, thereby allowing placement of the upper board with the circuit board attached thereon on the lower board in a manner where the snap fitting devices are respectively inserted through the hooking grooves and, via turning the rear end of the lever, the guide groove drives a relative slide of the positioning pin along the sliding slot whereby the snap fitting devices of the lower board respectively snap fit with the hooking grooves of the upper board.

2. The fast installation/removal structure of claim 1, wherein a peripheral side of the upper board forms a first bent edge to position the circuit board on the upper board.

3. The fast installation/removal structure of claim 1 or 2, wherein a portion of the peripheral side of the upper board further forms a bent hole connecting panel that includes a connecting opening corresponding to a connector of the circuit board for receiving an engagement of an external connector, a periphery of the hole connecting panel further forms a second bent edge over the upper board; the rear panel has a connector opening provided with a third bent edge, the hole connecting panel not engaging through the connector opening when the upper board is securely fastened.

4. The fast installation/removal structure of claim 1, wherein the upper board includes a plurality of first threaded holes through which engage a plurality of screws to fasten securely the circuit board.

5. The fast installation/removal structure of claim 1, wherein each hooking groove of the upper board respectively includes a locating opening.

6. The fast installation/removal structure of claim 5, wherein each hooking groove of the upper board further respectively includes a snap-fitting slot.

7. The fast installation/removal structure of claim 1, wherein a peripheral region of the lower board is provided with;a plurality of second threaded holes for fastening with the rear panel of the casing of the electric appliance.

8. The fast installation/removal structure of claim 1, wherein a first peripheral side of the lower board forms a first attaching strip upwardly bent in a step-shape for positioning the upper board, a second peripheral side of the lower board forms a second attaching strip downwardly bent and provided with a plurality of fastening holes for fastening with a lateral panel of the casing of the electric appliance, and a plurality of upward projections are formed on the lower board corresponding to the second attaching strip to position the upper board.

9. The fast installation/removal structure of claim 1, wherein a side of the lower board is provided With a side slot wherethrough is inserted the installation/removal lever.

10. The fast installation/removal structure of claim 5, wherein each snap fitting device of the lower board respectively includes a hooking finger corresponding to the locating opening the upper board for snap fitting a rim of the locating opening.

11. The fast installation/removal structure of claim 6, wherein each snap fitting device of the lower board includes a snap fitting strip connected to the lower board, the snap fitting strip snap fitting through a corresponding snap fitting lot of the upper board.

12. The fast installation/removal structure of claim 9, wherein a first pivotal hole is formed through the lower board between the sliding slot and the side slot, and the guide groove of the installation/removal lever being arcuate with a center of curvature wherefrom a second pivotal hole is eccentrically formed through the lever, the lower board and the lever being pivotally connected via a connecting element inserted through the first and second pivotal holes.

13. The fast installation/removal structure of claim 12, wherein a separation anchoring protrusion and an engagement anchoring protrusion are respectively formed on a bottom of the lower board proximate to the side slot in a manner to be equidistant to the first pivotal hole, and a central portion of the installation/removal lever further includes a positioning hole, a distance of which with the second pivotal hole is equal to that between the separation or engagement anchoring protrusion and the first pivotal hole.

14. The fast installation/removal structure of claim 9, wherein the rear end of the installation/removal lever forms an operating portion that is outside the side slot of the lower board.

\* \* \* \* \*